US012810947B2

(12) United States Patent
Iam et al.

(10) Patent No.: US 12,810,947 B2
(45) Date of Patent: Nov. 24, 2026

(54) MEMORY DEVICE COARSE THRESHOLD ESTIMATE READ UNDER MULTI-PLANE MODE

(71) Applicant: Micron Technology, Inc., Boise, ID (US)

(72) Inventors: Luis Iam, San Jose, CA (US); Zhengang Chen, San Jose, CA (US); Devin Batutis, San Jose, CA (US); Dheeraj Srinivasan, San Jose, CA (US)

(73) Assignee: Micron Technology, Inc., Boise, ID (US)

(*) Notice: Subject to any disclaimer, the term of this patent is extended or adjusted under 35 U.S.C. 154(b) by 111 days.

(21) Appl. No.: 19/033,103

(22) Filed: Jan. 21, 2025

(65) Prior Publication Data

US 2025/0239311 A1 Jul. 24, 2025

Related U.S. Application Data

(60) Provisional application No. 63/623,516, filed on Jan. 22, 2024.

(51) Int. Cl.
*G11C 16/26* (2006.01)
*G11C 16/04* (2006.01)

(52) U.S. Cl.
CPC .......... *G11C 16/26* (2013.01); *G11C 16/0483* (2013.01)

(58) Field of Classification Search
CPC .. G11C 16/26; G11C 16/0483; G11C 11/5642
USPC ........................................ 365/185.18
See application file for complete search history.

(56) References Cited

U.S. PATENT DOCUMENTS

2014/0056066 A1 2/2014 Baum et al.
2014/0241057 A1* 8/2014 Funatsuki ............ G11C 16/102 365/185.17
2022/0199154 A1 6/2022 Nguyen et al.
2023/0307055 A1 9/2023 Miranda et al.
2023/0359388 A1 11/2023 Nguyen et al.
2024/0005996 A1 1/2024 Siviero et al.
2026/0004858 A1* 1/2026 Nguyen .............. G11C 11/5642

FOREIGN PATENT DOCUMENTS

WO 2025160072 7/2025

OTHER PUBLICATIONS

"International Application Serial No. PCT US2025 012425, International Search Report mailed May 13, 2025", 4 pages.
"International Application Serial No. PCT US2025 012425, Written Opinion mailed May 13, 2025", 4 pages.

* cited by examiner

*Primary Examiner* — Fernando Hidalgo
(74) *Attorney, Agent, or Firm* — Schwegman Lundberg & Woessner, P.A.

(57) ABSTRACT

Various embodiments provide for performance of a coarse threshold estimate (CTE) read on a memory device of a memory system under multi-plane mode, such as a memory sub-system.

20 Claims, 10 Drawing Sheets

MEMORY DEVICE COARSE THRESHOLD ESTIMATE READ UNDER MULTI-PLANE MODE

PRIORITY APPLICATION

This application claims the benefit of priority to U.S. Provisional Application Ser. No. 63/623,516, filed Jan. 22, 2024, which is incorporated herein by reference in its entirety.

TECHNICAL FIELD

Example embodiments of the disclosure relate generally to memory devices and, more specifically, to performing a coarse threshold estimate (CTE) read on a memory device (e.g., NOT-AND (NAND)-type memory device) of a memory system under multi-plane mode, such as a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
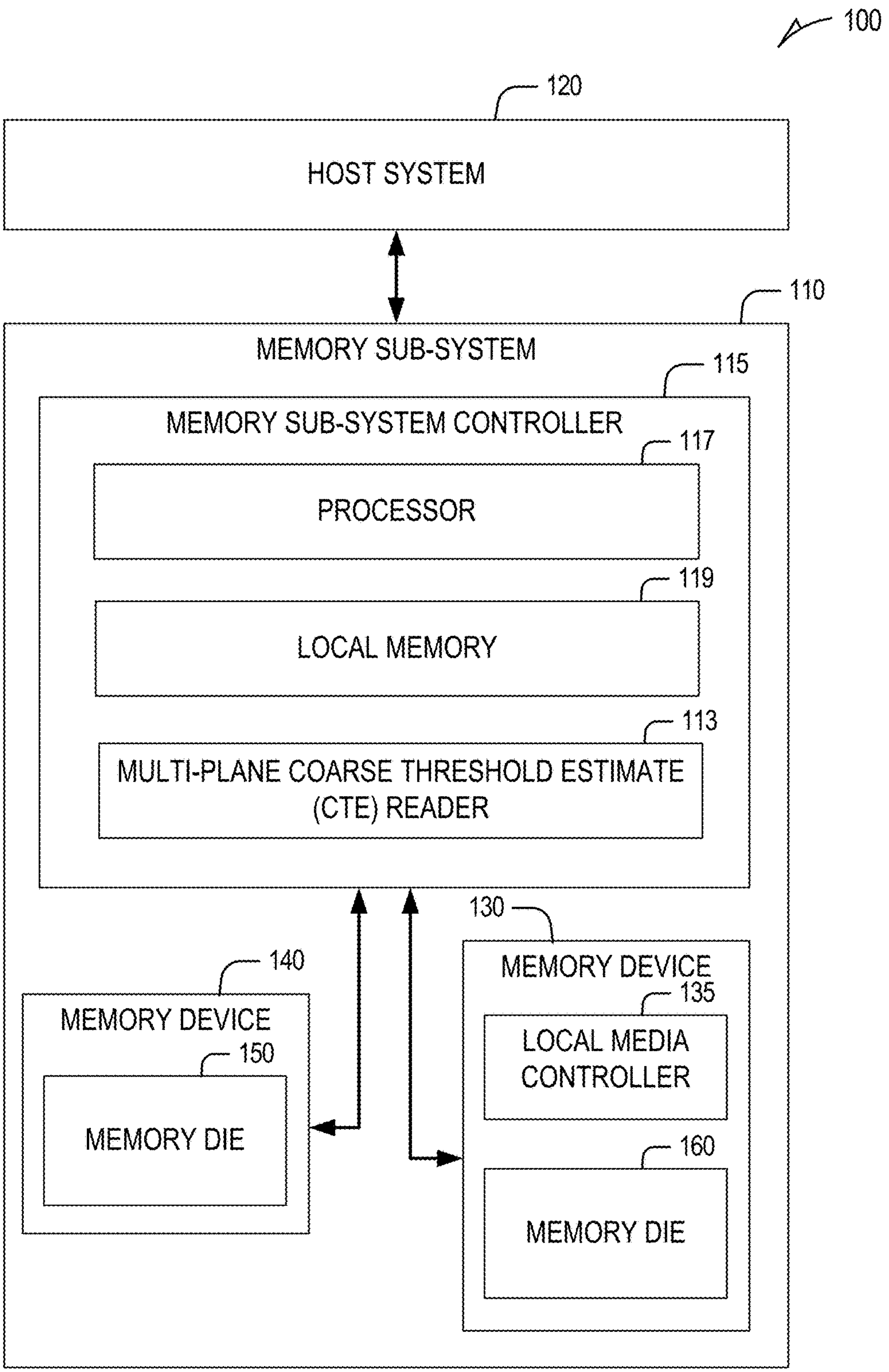
FIG. 1 is a block diagram illustrating an example computing system that includes a memory sub-system, in accordance with some embodiments of the present disclosure.

Aspects of the present disclosure are directed to performing a coarse threshold estimate (CTE) read on a memory device (e.g., NAND-type memory device) of a memory system under multi-plane mode, such as a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can send access requests to the memory sub-system, such as to store data at the memory sub-system and to read data from the memory sub-system.

The host system can send access requests (e.g., write commands, read commands) to the memory sub-system, such as to store data on a memory device at the memory sub-system, read data from the memory device on the memory sub-system, or write/read constructs with respect to a memory device on the memory sub-system. The data to be read or written, as specified by a host request (e.g., data access request or command request), is hereinafter referred to as "host data." A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., error-correcting code (ECC) codeword, parity code), data version (e.g., used to distinguish age of data written), valid bitmap (which LBAs or logical transfer units contain valid data), and so forth.

The memory sub-system can initiate media management operations, such as a write operation on host data that is stored on a memory device or a scan (e.g., media scan) of one or more blocks of a memory device. For example, firmware of the memory sub-system can re-write previously written host data from a location of a memory device to a new location as part of garbage collection management operations. The data that is re-written, for example as initiated by the firmware, is hereinafter referred to as "garbage collection data."

"User data" hereinafter generally refers to host data and garbage collection data. "System data" hereinafter refers to data that is created and/or maintained by the memory sub-system for performing operations in response to host requests and for media management. Examples of system data include, and are not limited to, system tables (e.g., logical-to-physical memory address mapping table (also referred to herein as an L2P table), data from logging, scratch pad data, and so forth).

A memory device can be a non-volatile memory device. A non-volatile memory device is a package of one or more die. Each die can comprise one or more planes. For some types of non-volatile memory devices (e.g., NOT-AND (NAND)-type devices), each plane comprises a set of physical blocks. For some memory devices, blocks are the smallest area that can be erased. Each block comprises a set of pages. Each page comprises a set of memory cells, which store bits of data. The memory devices can be raw memory devices (e.g., NAND), which are managed externally, for example, by an external controller. The memory devices can be managed memory devices (e.g., managed NAND), which are raw memory devices combined with a local embedded controller for memory management within the same memory device package.

Generally, writing data to such memory devices involves programming (by way of a program operation) the memory devices at the page level of a block, and erasing data from such memory devices involves erasing the memory devices at the block level (e.g., page level erasure of data is not possible). Certain memory devices, such as NAND-type memory devices, comprise one or more blocks, (e.g., multiple blocks) with each of those blocks comprising multiple pages, where each page comprises a subset of memory cells of the block, and where a single wordline of a block (which connects a group of memory cells of the block together) defines one or more pages of a block (depending on the type of memory cell). Depending on the embodiment, different blocks can comprise different types of memory cells. For instance, a block (a single-level cell (SLC) block) can comprise multiple SLCs, a block (a multi-level cell (MLC) block) can comprise multiple MLCs, a block (a triple-level cell (TLC) block) can comprise multiple TLCs, a block (a quad-level cell (QLC) block) can comprise QLCs, and a block (a penta-level cell (PLC) block) can comprise PLCs. Other blocks comprising other types of memory cells (e.g., higher-level memory cells, having higher bit storage-per-cell) are also possible.

Each worldline (of a block) can define one or more pages depending on the type of memory cells (of the block) connected to the wordline. For example, for an SLC block, a single wordline can define a single page. For a MLC block, a single wordline can define two pages-a lower page (LP) and an upper page (UP). For a TLC block, a single wordline can define three pages—a lower page (LP), an upper page (UP), and an extra page (XP). For a QLC block, a single wordline can define four pages—a lower page (LP), an upper page (UP), an extra page (XP), and a top page (TP) page. As used herein, a page of LP page type can be referred to as a "LP page," a page of UP page type can be referred to as a "UP page," a page of XP page type can be referred to as a "XP page," and a page of TP page type can be referred to as a "TP page." Each page type can represent a different level of a cell (e.g., QLC can have a first level for LPs, a second level for UPs, a third level for XPs, and a fourth level for TPs). To write data to a given page, the given page is programmed according to a page programming algorithm (e.g., that causes one or more voltage pulses or pulses to memory cells of a block based on the memory).

The latency of read error handling (REH) of memory systems (e.g., memory sub-systems) becomes more important as NAND-type memory devices scale and as performance requirements of managed memory systems (e.g., requirements of Universal Flash Store (UFS) have increased with each new version) increase. Generally, REH is needed to recover data when a NAND-type memory device experiences stress, which can impact performance of the NAND-type memory device (e.g., such as data retention). Higher REH latency can lead to command timeout or lower performance when the NAND-type memory device is under performance stress (e.g., media of the NAND-type memory device is under stress). To improve REH latency, a coarse threshold estimate (CTE) read can be provided and used on NAND-type memory devices, which provides a per-strobe failed bit count (CFBit) status that enables reliable threshold-voltage valley (or valley) search in REH. There are two types of CTE read: CFBit read, which is a page read (e.g., of a page of a TLC block) that provides a failing bit count (CFBit) value representing the number of bits on a right side of the read voltage level of a read strobe; and a CFByte read, which is a page read that provides a failing bit count (CFBit) value representing the number of bytes on a right side of the highest read voltage level of a read strobe. The highest read voltage level can depend on the type of page being read, such as a page of a SLC, MLC, TLC, or QLC block. For example, a highest read voltage level of a page of a TLC block would be read level 7 (R7), so the CFByte value provided by a CFByte read would represent a count of bytes on a right side of read level 7 (R7). A CTE read can be used in many different ways to search for one or more valleys, which can be used by a calibration process of a read voltage level (also referred to as read level calibration process) of a memory system that uses per-strobe CFBit status. Examples of CFBit read and CFByte read on a page of TLC block are illustrated and described with respect to FIG. 2.

As previously mentioned, NAND-type memory devices comprise multiple memory cells. Each of theses memory cells can comprise a floating-gate transistor, where the level of an electrical charge "trapped" in the floating gate of the floating-gate transistor (of an individual memory cell) can represent one or more bits stored by the individual memory cell. When a charge is applied to the floating gate of the floating-gate transistor (of a memory cell), the charge remains "trapped" there due to the insulating properties of the surrounding materials, and this "trapped" charge alters a threshold voltage of the floating-gate transistor, which in turn changes the floating-gate transistor's conductive state. Once a threshold voltage is determined for the floating-gate transistor of a memory cell, the threshold voltage can be translated (e.g., decoded) to one or more bits of data that represent the data currently stored on the memory cell. Accordingly, reading data from a given memory cell can involve detecting the threshold voltage a floating-gate transistor of the given memory cell.

Detecting the threshold voltage of memory cells of a wordline (e.g., where corresponds to one or more pages depending on the type of memory cell) of a NAND-type memory device can involve performing one or more read strobes on the wordline. A read strobe can comprise applying a read voltage level (also referred to as a read level) to a chosen wordline and sensing a response from applying the read voltage level, thereby obtaining sensed data that can be used to identify memory cells (of the chosen wordline) that have their respective threshold voltages below or above the applied read level. Usually, performing a read operation on one or more memory cells of a chosen wordline (e.g., one or more memory cells of a given page) comprises performing (e.g., applying) multiple read strobe on the chosen wordline to determine threshold voltages of the one or more memory cells.

Upon performing a read strobe on a chosen wordline, some NAND-memory devices return metadata with sensed data, where metadata comprises one or more metadata values that characterize the applied read voltage level with respect to the threshold voltage distributions of memory cells of the chosen wordline. The metadata can reflect the conductive state of a subset of bitlines that are connected to memory cells forming at least a portion of the chosen wordline. For example, the metadata can include a failed byte count (CFByte) value, which reflects (i.e., is equal to or is derived by a known transformation from) a number of bytes in the sensed data that have at least one non-conducting bitline (e.g., number of bytes on a right side of the read voltage level of a read strobe). Additionally, the metadata can include a failed bit count (CFBit) value, which reflects (i.e., is equal to or is derived by a known transformation from) a number of bits in the sensed data that have at least one non-conducting bitline (e.g., number of bits on a right side of the read voltage level of a read strobe). The metadata generated and returned by a read strobe can be generated for one or more memory pages of a chosen wordline, or for a smaller portion of those one or more pages (e.g., in order to reduce latency).

Typically, the metadata can be utilized by a memory system (e.g., a memory sub-system controller or a local media controller) for adjusting a read voltage level (applied by a read strobe) in a manner that would either minimize the read operation latency while providing at least a specified accuracy (e.g., a chosen error metric not exceeding a threshold value) of the read operation, or maximize the read operation accuracy while not exceeding a specified latency of the read operation.

A memory system (e.g., controller thereof) can, for example, perform a read strobe and decode the sensed data returned by the read strobe. If the decoding operation fails, the memory system can use metadata returned with the sensed data (e.g., CFBit or CFByte value) to determine the read voltage adjustment for performing one or more subsequent read strobes with respect to a wordline to which the initial read strobe has been applied, or to one or more neighboring wordlines of that wordline. This sequence of read level adjustment (e.g., calibration) and read operations can be iteratively performed until either the sensed data is successfully decoded (in which case no further action is needed) or a predefined maximum number of iterations have been performed. In this way, the read voltage level can be calibrated using metadata (e.g., CFBit or CFByte value) As an example, a memory system can a read strobe and adjust a read voltage level of the read strobe based on a failed byte count (CFByte) value for a highest logical programming level. If a next read strobe results in a value of a chosen data state metric (e.g., BEC or RBER) outside of a desired or expected range, the memory system can perform another read strobe and adjust the read voltage level based on the failed bit count (CFBit) value for at least a subset of logical programming levels. This sequence of read level adjustment (e.g., calibration) and read operations can be iteratively performed until either the sensed data is successfully decoded or a predefined maximum number of iterations have been performed.

Per-strobe CFBit count value provided by a CTE read can be used to search for one or more valleys for a calibration process, such as a CFBit calibration process, a CFByte calibration process, or a histogram-based calibration process. Generally, a calibration process (e.g., read level calibration process) can use a CTE read to track voltage threshold shift caused by slow charge loss or temperature, or to compensate for the program and read disturb or physical defects of a storage media. A CFBit calibration process (e.g., algorithm) can use per-strobe CFBit value provided by a CFBit CTE read directly (e.g., as a 0's count metric) to move one or more read levels for a target page into correct valleys using a small number of reads (e.g., 1 to 3 reads). Typically, the CFBit calibration process is based on the assumption that the data written to a NAND-type memory device is randomized and the read levels of one or more pages (e.g., 2, 4, 8, and 16 read levels of a page of a SLC, MLC, TLC, and QLC block respectively) are equally distributed. A CFByte calibration process (e.g., algorithm) can use a CFByte CTE read to generate CFByte value for a highest valley of a page type, which can be used for fast and coarse calibration in REH by a CFByte calibration process (e.g., algorithm). A histogram-based calibration process can use one or more histograms, generated by taking the differential of per-strobe CFBit value (provided by a CTE read), to finely calibrate a read level of a page to a valley bottom.

Unfortunately, a CTE read (e.g., CFBit or CFByte read) on conventional memory systems is usually performed under a single-plane mode and, under certain conditions (e.g., moderate to deep retention conditions, large cross-temp conditions, or both), a sequential read of a NAND-type memory device can encounter error recovery events on multiple planes simultaneously. While the initial steps in REH can be performed on multiple planes using one or more multi-plane (MP) read commands, steps that use CTE read are usually performed (e.g., executed) plane-by-plane. As a result, a conventional REH process that uses CTE read can waste (N−1)xtR worth of time (where N is the # of planes, and tR is the time needed to perform a CTE read) performing redundant CTE reads under single-plane mode, thereby adding to the latency of the conventional REH process.

Various embodiments presented herein provide can cure these and other deficiencies of conventional CTE read under single-plane mode and conventional REH process that use conventional CTE read under single-plane mode. In particular, various embodiments presented herein provide for or otherwise enable a coarse threshold estimate (CTE) read on a memory device (e.g., NAND-type memory device) of a memory system under multi-plane mode, such as a memory sub-system. Hereafter, a coarse threshold estimate (CTE) read performed under multi-plane mode can also be referred to as a multi-plane coarse threshold estimate (MP CTE). According to some embodiments, a CTE read under multiple-plane mode (MP) can be used by a read-level calibration process, such as a CFBit calibration process, a CFByte calibration process, or a histogram-based calibration process, to adjust (e.g., calibrate) a read level of a read strobe on multiple planes (to improve the bit error rate when reading memory cells on those multiple planes). As noted herein, one or more such read-level calibration processes can be performed as part of REH. By using CTE read under MP mode (using a MP CTE read), a read level calibration process can adjust a read level of a read strobe on multiple planes of a memory device without needing to perform the read level calibration process (and associated CTE reads) on each plane of those multiple planes separately. In this way, some embodiments reduce the latency of REH on a memory system. As used herein, a multi-plane (MP) calibration process can refer to a calibration process that calibrates read levels on multiple planes of a memory device. For example, as used herein, a MP CFBit calibration process can refer to a CFBit calibration process that uses a CTE read under MP mode, a MP CFByte calibration process can refer to a CFByte calibration process that uses a CTE read under MP mode, and a MP histogram-based calibration process can refer to a histogram-based calibration process that uses a CTE read under MP mode. Depending on the embodiment, a CTE read under MP mode (or a MP calibration process that is using a CTE read under MP mode) can be performed by local media controller of a memory device of a memory system, or a memory controller of the memory system (e.g., memory sub-system controller of the memory sub-system).

Overall, use of multi-plane CTE read in accordance with various embodiments improves (e.g., reduces) latency (e.g., of REH) compared to use of a single-mode CTE read. For instance, multi-plane CFBit calibration can have latency improvement using multi-plane CTE read with single-plane counting. A multi-plane histogram-based calibration process can have latency improvement by using multi-plane CTE read with multi-plane counting (e.g., during the early calibration step of the multi-plane histogram-based calibration process), and further by applying different read voltage level offsets (e.g., via a 2Eh command or an independent wordline (iWL) read) when read voltage levels start to diverge across different planes.

While some examples described herein involve triple level cell (TLC) voltage distributions, in various other embodiments, similar techniques can be implemented for memory pages storing other numbers of bits per cell.

Disclosed herein are some examples of stripe-based read error handling for a multi-plane coarse threshold estimate read on a memory device (e.g., NAND-type memory device) of a memory system, as described herein.

FIG. 1 illustrates an example computing system 100 that includes a memory sub-system 110, in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, a secure digital (SD) card, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., NVDIMM controller), and a storage protocol controller (e.g., a peripheral component interconnect express (PCIe) controller, serial advanced technology attachment (SATA) controller). The host system 120 uses the memory sub-system 110, for example, to write data to the memory sub-system 110 and read data from the memory sub-system 110.

The host system 120 can include or be coupled to the memory sub-system 110 so that the host system 120 can read data from or write data to the memory sub-system 110. The host system 120 can be coupled to the memory sub-system 110 via a physical host interface. Examples of a physical host interface include, but are not limited to, a serial advanced technology attachment (SATA) interface, a peripheral component interconnect express (PCIe) interface, a compute express link (CXL) interface, a universal serial bus (USB) interface, a Fibre Channel interface, a Serial Attached SCSI (SAS) interface, etc. The physical host interface can be used to transmit data between the host system 120 and the memory sub-system 110. The host system 120 can further utilize an NVM Express (NVMe) interface to access the memory devices 130, 140 when the memory sub-system 110 is coupled with the host system 120 by the PCIe or CXL interface. The physical host interface can provide an interface for passing control, address, data, and other signals between the memory sub-system 110 and the host system 120.

FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random-access memory (SDRAM).

Some examples of non-volatile memory devices (e.g., memory device 130) include a NAND type flash memory and write-in-place memory, such as a three-dimensional (3D) cross-point memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional (2D) NAND and 3D NAND.

Each of the memory devices 130 can include one or more arrays of memory cells. One type of memory cell, for example, SLCs, can store one bit per cell. Other types of memory cells, such as MLCs, TLCs, QLCs, and penta-level cells (PLCs), can store multiple or fractional bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks. As used herein, a block comprising SLCs can be referred to as a SLC block, a block comprising MLCs can be referred to as an MLC block, a block comprising TLCs can be referred to as a TLC block, and a block comprising QLCs can be referred to as a QLC block.

Although non-volatile memory components such as NAND type flash memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide-based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide-based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or another suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, and so forth. The local memory 119 can also include ROM for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands, requests, or operations from the host system 120 and can convert the commands, requests, or operations into instructions or appropriate commands to achieve the desired access to the memory devices 130 and/or the memory device 140. The memory sub-system controller 115 can be responsible for other operations such as wear leveling operations, garbage collection operations, error detection and ECC operations, encryption operations, caching operations, and address translations between a logical address (e.g., LBA, namespace) and a physical memory address (e.g., physical block address) that are associated with the memory devices 130. The memory sub-system controller 115 can further include host interface circuitry to communicate with the host system 120 via the physical host interface. The host interface circuitry can convert the commands received from the host system 120 into command instructions to access the memory devices 130 and/or the memory device 140 as well as convert responses associated with the memory devices 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local media controller 135) for media management within the same memory device package. An example of a managed memory device is a managed NAND (MNAND) device.

Each of the memory devices 130, 140 include a memory die 150, 160. For some embodiments, each of the memory devices 130, 140 represents a memory device that comprises a printed circuit board, upon which its respective memory die 150, 160 is solder mounted.

The memory sub-system controller 115 includes a multi-plane coarse threshold estimate (CTE) reader 113 that enables or facilitates the memory sub-system controller 115 to perform a coarse threshold estimate (CTE) read on a memory device (e.g., 130, 140) of the memory sub-system 110 under multi-plane mode as described herein. Some or all of the multi-plane coarse threshold estimate (CTE) reader 113 is included by the local media controller 135 to perform a coarse threshold estimate (CTE) read on a memory device (e.g., 130, 140) of the memory sub-system 110 under multi-plane mode as described herein.

Figure 2:
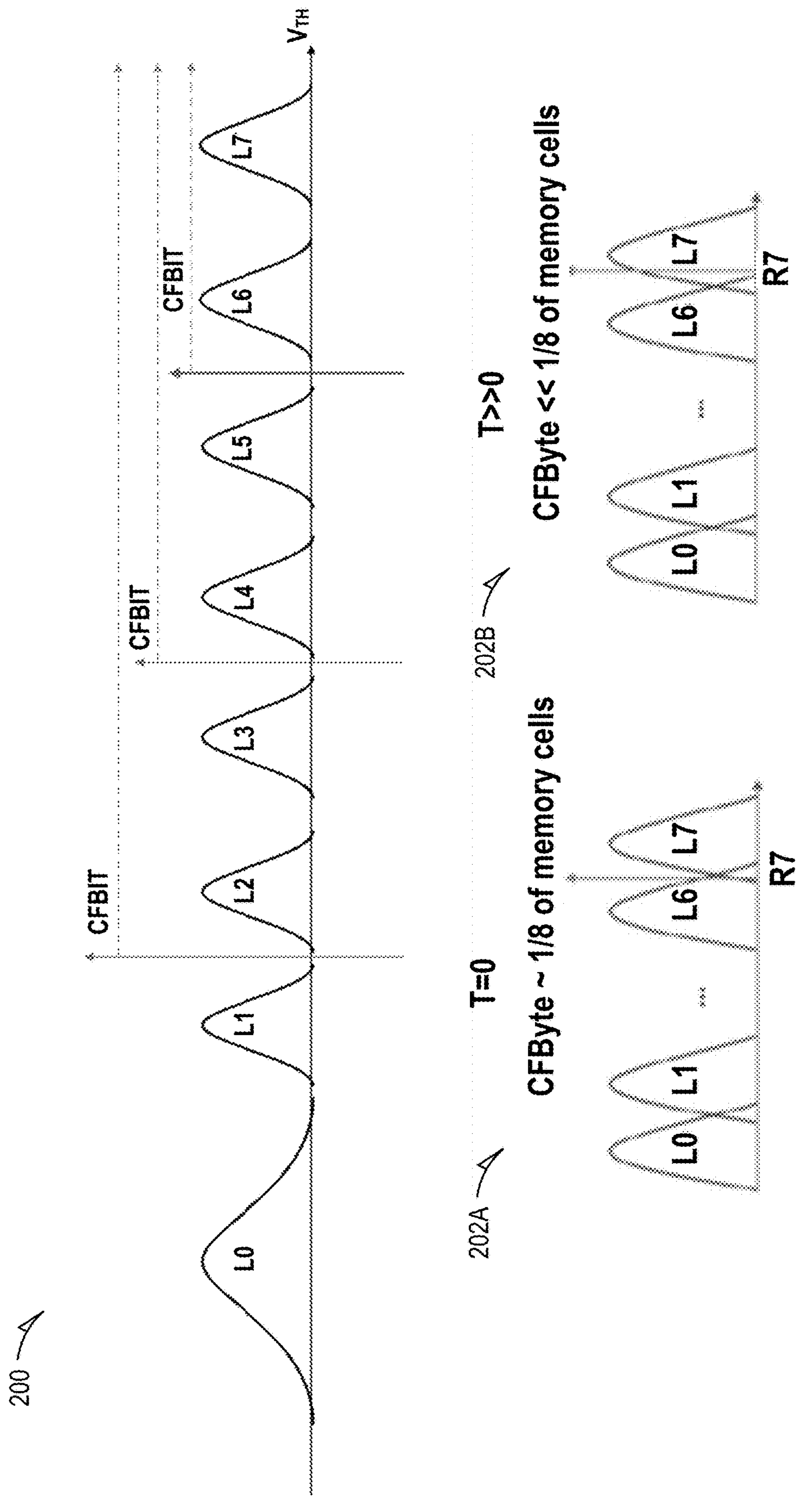
FIG. 2 provide graphs that illustrate examples of CFBit read and CFByte read on a page of TLC block, in accordance with some embodiments of the present disclosure.

FIG. 2 provide graphs 200, 202A, 202B that illustrate examples of CFBit read and CFByte read on a page of TLC block, in accordance with some embodiments of the present disclosure. In particular, graph 200 illustrates a CFBit read performed at three different read voltage levels (or read levels)—read level 2 (R2), read level 4 (R4), and read level (R6), which results in a CFBit value for based on each of those read levels. In graph 202A, a CFByte read performed on a page of a TLC block provides a CFByte value with respect to real level 7 (R7) of a read strobe at time 0 (T=0). In graph 202B, eventually another CFByte read performed on the same page of the same TLC block at a time much later than time 0 (T>>0), and the CFByte read provides a new CFByte value with respect to real level 7 (R7) of the read strobe. The difference shown in CFByte values provided at time T=0 and T>>0 can characterize the charge loss and data retention behavior of the memory cells of the page over time. This difference can be used to determine an adjustment to read level 7 (R7) of the read strobe, thereby calibrating read level 7.

FIGS. 3 through 7 illustrate flow diagrams of example methods 300, 400, 500, 600, 700 for performing a coarse threshold estimate (CTE) read on a memory device under multi-plane mode, in accordance with some embodiments of the present disclosure. Any of methods 300, 400, 500, 600, 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, one or more of methods 300, 400, 500, 600, 700 is performed by the memory sub-system controller 115 of FIG. 1 based on the multi-plane coarse threshold estimate (CTE) reader 113. Additionally, or alternatively, for some embodiments, one or more of methods 300, 400, 500, 600, 700 is performed, at least in part, by the local media controller 135 of the memory device 130 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are used in every embodiment. Other process flows are possible.

Figure 3:
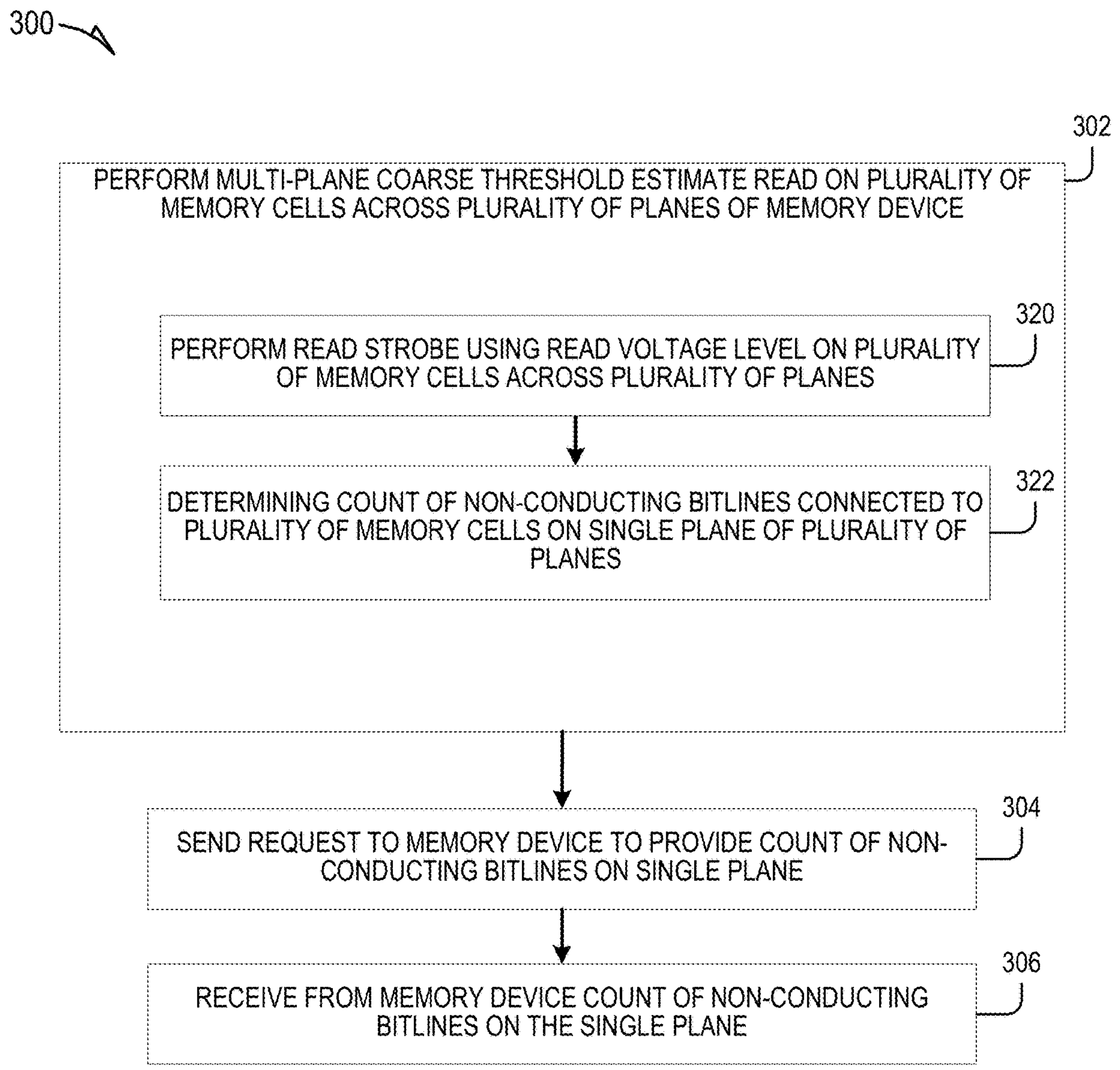
FIGS. 3 through 7 illustrate flow diagrams of example methods for performing a coarse threshold estimate (CTE) read on a memory device under multi-plane mode, in accordance with some embodiments of the present disclosure.

Referring now to method 300 of FIG. 3, at operation 302, a processing device (e.g., the processor 117 of the memory sub-system controller 115, or the local media controller 135) performs a multi-plane coarse threshold estimate read on a plurality of memory cells (or a subset thereof) across a plurality of planes (or a sub-plurality thereof) of a memory device (e.g., across all planes of the memory device). As shown, operation 302 comprises performing operations 320 and 322. Operation 320 comprises performing (e.g., applying) a read strobe using a read voltage level on the plurality of memory cells (or the subset thereof) across the plurality of planes (or the sub-plurality thereof). Operation 322 comprises determining a count of non-conducting bitlines connected to the plurality of memory cells on a single plane of the plurality of planes (or the sub-plurality thereof). According to some embodiments, the count of non-conducting bitlines on the single plane is representative of all of the plurality of planes (or the sub-plurality thereof). For various embodiments, operations 320 and 322 are performed on and by the memory device in response to receiving a request (e.g., from the processor 117 of the memory sub-system controller 115, or the local media controller 135) to perform the multi-plane coarse threshold estimate read.

Depending on the embodiment, the multi-plane coarse threshold estimate read can be performed as part of a read-level calibration process. For instance, the multi-plane coarse threshold estimate read can be performed as part of a multi-plane failed bit count (CFBit) calibration process, or as part of a multi-plane failed byte count (CFByte) calibration process. The multi-plane CFBit calibration process can be configured to adjust one or more read voltage levels of the read strobe on each plane of the at least sub-plurality of planes based on the count of non-conducting bitlines on the single plane, where the count of non-conducting bitlines on the single plane is a failed bit count. The multi-plane failed byte count (CFByte) can be configured to adjust one or more read voltage levels of the read strobe on each plane of the at least sub-plurality of planes based on the count of non-conducting bitlines on the single plane, where the count of non-conducting bitlines on the single plane is a failed byte count.

At operation 304, the processing device (e.g., the processor 117 of the memory sub-system controller 115, or the local media controller 135) sends a request to the memory device to provide (e.g., send to the processor 117 or the local media controller 135) the count of non-conducting bitlines on the single plane. For some embodiments, the multi-plane coarse threshold estimate read is configured to select the single plane based on a user-defined parameter. In response to the request, at operation 306, the processing device (e.g., the processor 117 of the memory sub-system controller 115, or the local media controller 135) receives, from the memory device, the count of non-conducting bitlines on the single plane. For some embodiments, the count of non-conducting bitlines on the single plane is automatically provided by the memory device without need for sending a request to the memory device. Additionally, for some embodiments, the count of non-conducting bitlines on the single plane is received as part of a set of metadata values received from the memory device, where the set of metadata values characterizes the read voltage level with respect to threshold voltage distributions of the subset of the plurality of memory cells.

Figure 4:
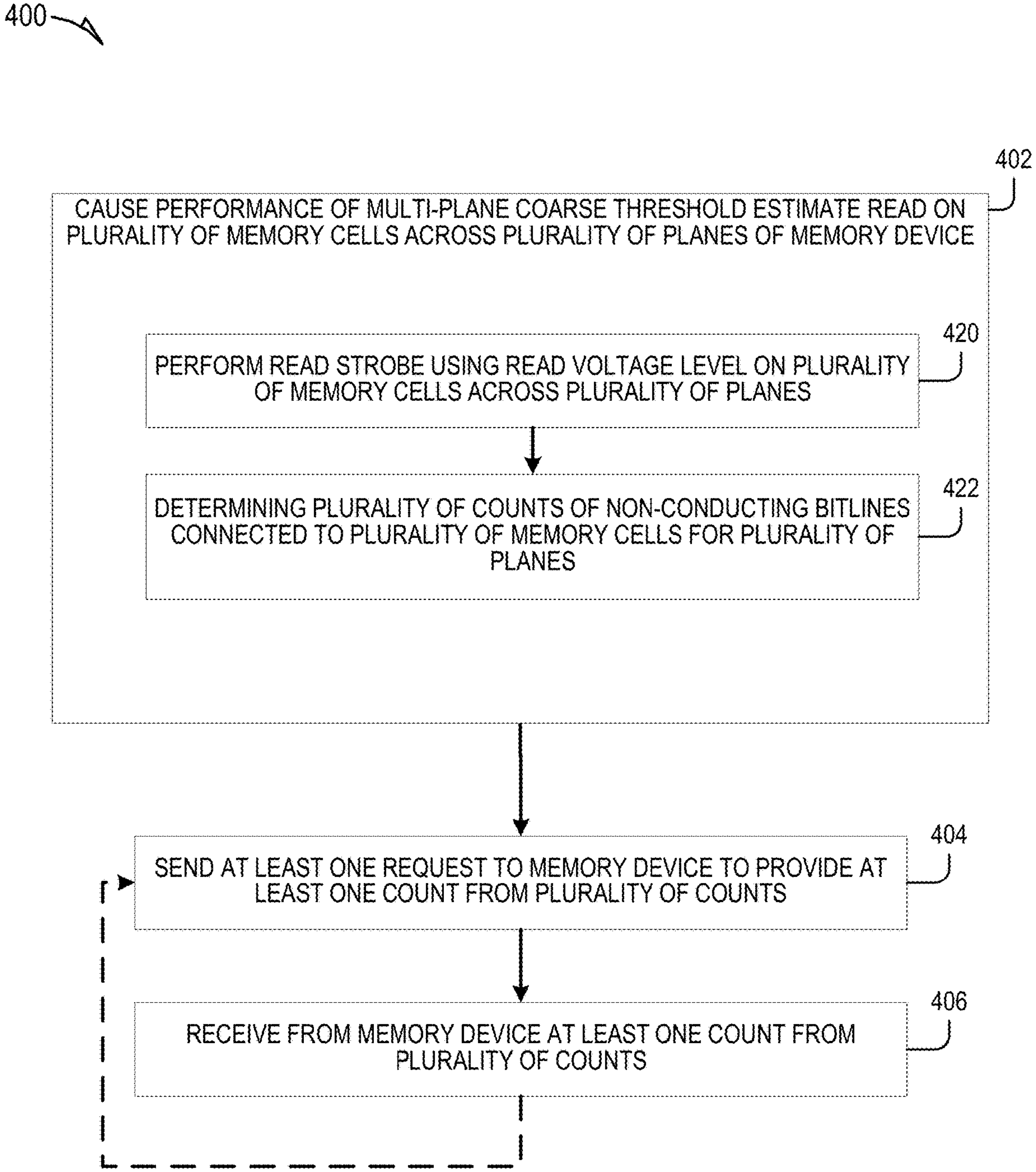

Referring now to method 400 of FIG. 4, at operation 402, a processing device (e.g., the processor 117 of the memory sub-system controller 115, or the local media controller 135) performs a multi-plane coarse threshold estimate read on a plurality of memory cells (or a subset thereof) across a plurality of planes (or a sub-plurality thereof) of a memory device (e.g., across all planes of the memory device). As shown, operation 402 comprises performing operations 420 and 422. Operation 420 comprises performing (e.g., applying) a read strobe using a read voltage level on the plurality of memory cells (or the subset thereof) across the plurality of planes (or the sub-plurality thereof). Operation 422 comprises determining a plurality of counts of non-conducting bitlines connected to the subset of the plurality of memory cells for the plurality of planes (or the sub-plurality thereof). Each count in the plurality of counts can correspond to a count of non-conducting bitlines (connected to the subset of the plurality of memory cells) on a different plane of the plurality of planes. For some embodiments, the plurality of counts is determined by serially determining, for each individual plane of the plurality of planes (or the sub-plurality thereof), an individual count of non-conducting bitlines connected to the subset of the plurality of memory cells on the individual plane. Alternatively, for some embodiments, the plurality of counts is determined by determining, in parallel for each individual plane of the plurality of planes (or the sub-plurality thereof), an individual count of non-conducting bitlines connected to the subset of the plurality of memory cells on the individual plane. For various embodiments, operations 420 and 422 are performed on and by the memory device in response to receiving a request (e.g., from the processor 117 of the memory sub-system controller 115, or the local media controller 135) to perform the multi-plane coarse threshold estimate read.

Depending on the embodiment, the multi-plane coarse threshold estimate read can be performed as part of a read-level calibration process. For instance, the multi-plane coarse threshold estimate read can be performed as part of a multi-plane histogram-based calibration process. The multi-plane histogram-based calibration process can be configured to adjust one or more read voltage levels of the read strobe on each plane of the at least sub-plurality of planes based on the plurality of counts of non-conducting bitlines for the at least sub-plurality of planes.

At operation 404, the processing device (e.g., the processor 117 of the memory sub-system controller 115, or the local media controller 135) sends at least one request to the memory device to provide at least one count from the plurality of counts. In response to the request, at operation 406, the processing device (e.g., the processor 117 of the memory sub-system controller 115, or the local media controller 135) receives, from the memory device, the at least one count the plurality of counts. For some embodiments, operations 404 and 406 are performed iteratively to serially request and receive each individual count of the plurality of counts (e.g., serially sending a request for each individual count of the plurality of counts, and receiving the individual count). Alternatively, for some embodiments, operation 406 provides the plurality of counts all at once. Additionally, for some embodiments, the plurality of counts is automatically provided by the memory device without need for sending a request to the memory device.

Figure 5:
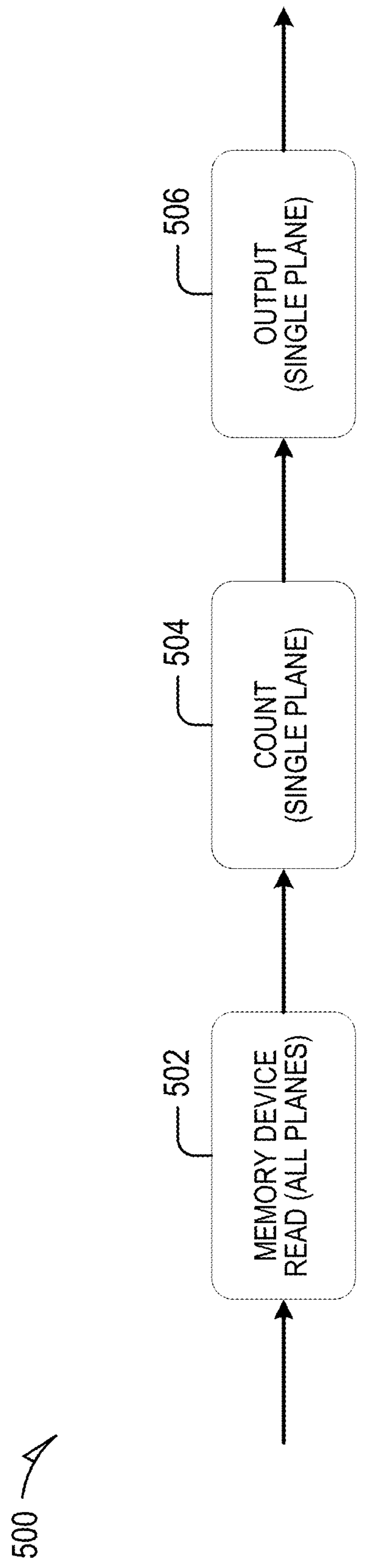

Referring now to method 500 of FIG. 5, method 500 represents an example implementation of method 300. In particular, method 500 can represent use of multi-plane CTE read with single plane counting, where a count (e.g., CFBit or CFByte) is reported from only one of the planes. This technique can be particularly useful for a MP CFBit calibration, where rough calibration is performed to position read levels in the correct valleys close to the valley bottoms. As shown, at operation 502, all planes of a memory device are read. At operation 504, a count (e.g., CFBit or CFByte value) is determined for a single plane of the memory device, where the single plane can be selected based on a user-defined parameter. During operation 506, the count (e.g., CFBit status or CFByte status output), of the single plane is outputted. For some embodiments, operation 506 is performed in response to a request to the memory device to provide (e.g., output) the count.

Figure 6:
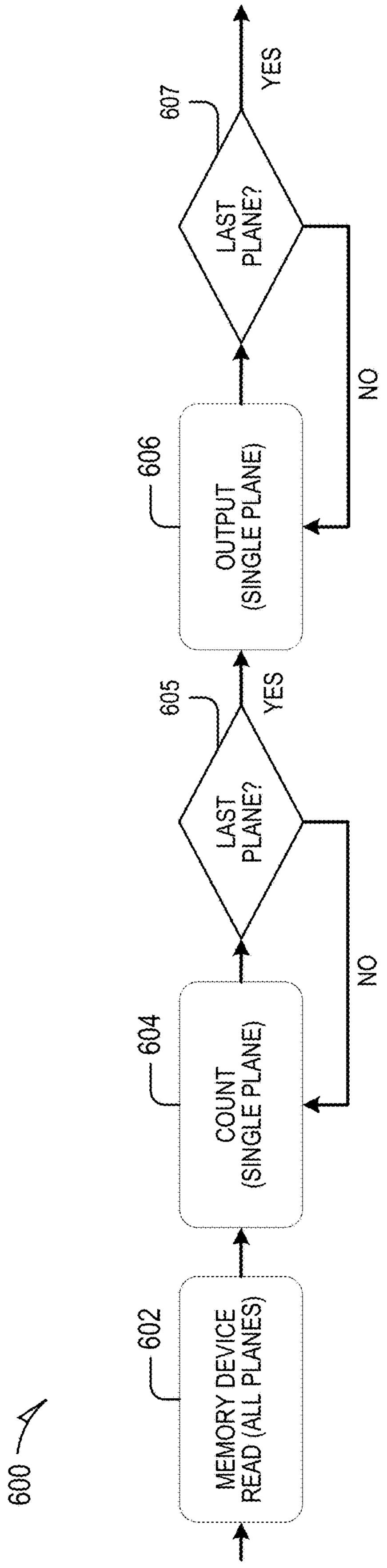

Referring now to method 600 of FIG. 6, method 600 represents an example implementation of method 400. In particular, method 600 can represent use of a multi-plane CTE read that determines counts for all planes serially. As shown, at operation 602, all planes of a memory device are read. At operation 604, a count (e.g., CFBit or CFByte value) is determined for a single plane of the memory device. Operation 605 determines whether operation 604 was performed for the last plane of the memory device. If operation 605 determines that operation 704 has not been performed for the last plane, method 600 returns to operation 604, where a count (e.g., CFBit or CFByte value) is determined for another (e.g., next) plane of the memory device. If, however, operation 605 determines that operation 604 was performed for the last plane, method 600 proceeds to operation 606. At operation 606, a determined count (e.g., CFBit status or CFByte status output) of one of the planes of the memory device is outputted. Operation 607 determines whether operation 606 has been performed for the last plane of the memory device. If operation 607 that operation 606 has not been performed for the last plane, method 600 returns to operation 606, where a determined count (e.g., CFBit or CFByte value) of another (e.g., next) plane of the memory device is outputted. If, however, operation 607 determines that operation 606 was performed for the last plane, method 600 ends. By operations 606 and 607, method 600 can serially provide (e.g., output) a determined count for each plane. For some embodiments, operation 606 is performed in response to a request to the memory device to provide (e.g., output) the count.

Figure 7:
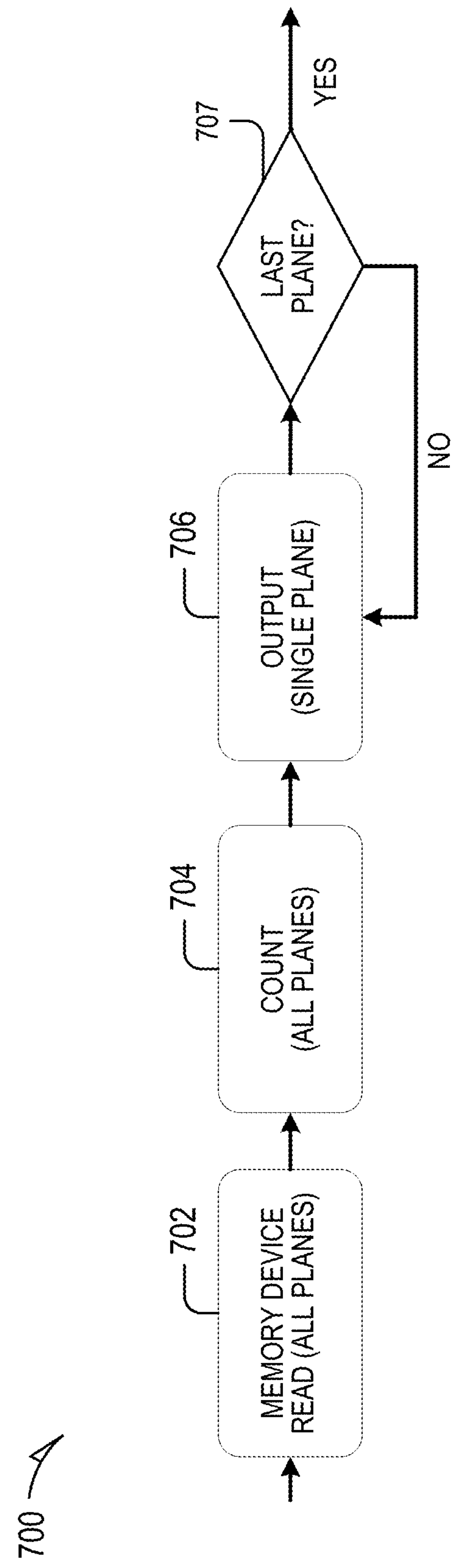

Referring now to method 700 of FIG. 7, method 700 represents an example implementation of method 400. In particular, method 700 can represent use of a multi-plane CTE read that determines counts for all planes in parallel. As shown, at operation 702, all planes of a memory device are read. At operation 704, a count (e.g., CFBit or CFByte value) is determined for each plane of the memory device in parallel. At operation 706, a determined count (e.g., CFBit status or CFByte status output) of one of the planes of the memory device is outputted. Operation 707 determines whether operation 706 has been performed for the last plane of the memory device. If operation 707 determines that operation 706 has not been performed for the last plane, method 700 returns to operation 706, where a determined count (e.g., CFBit or CFByte value) of another (e.g., next) plane of the memory device is outputted. If, however, operation 707 determines that operation 706 was performed for the last plane, method 700 ends. By operations 706 and 707, method 700 can serially provide (e.g., output) a determined count for each plane. For some embodiments, operation 706 is performed in response to a request to the memory device to provide (e.g., output) the count.

Figure 8:
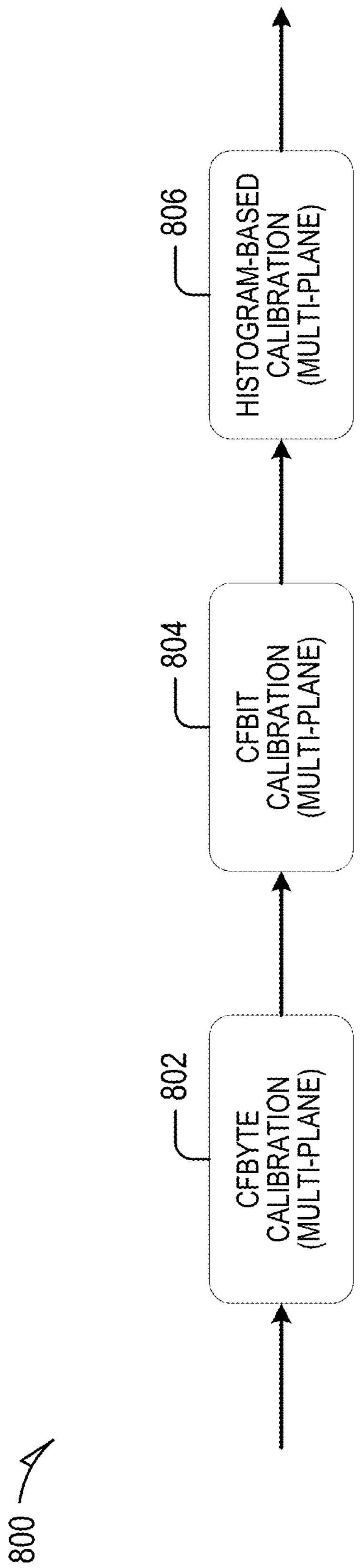
FIGS. 8 and 9 illustrate flow diagrams of example methods for performing a multi-plane read-level calibration process on a memory device using a coarse threshold estimate (CTE) read under multi-plane mode, in accordance with some embodiments of the present disclosure.
Figure 9:
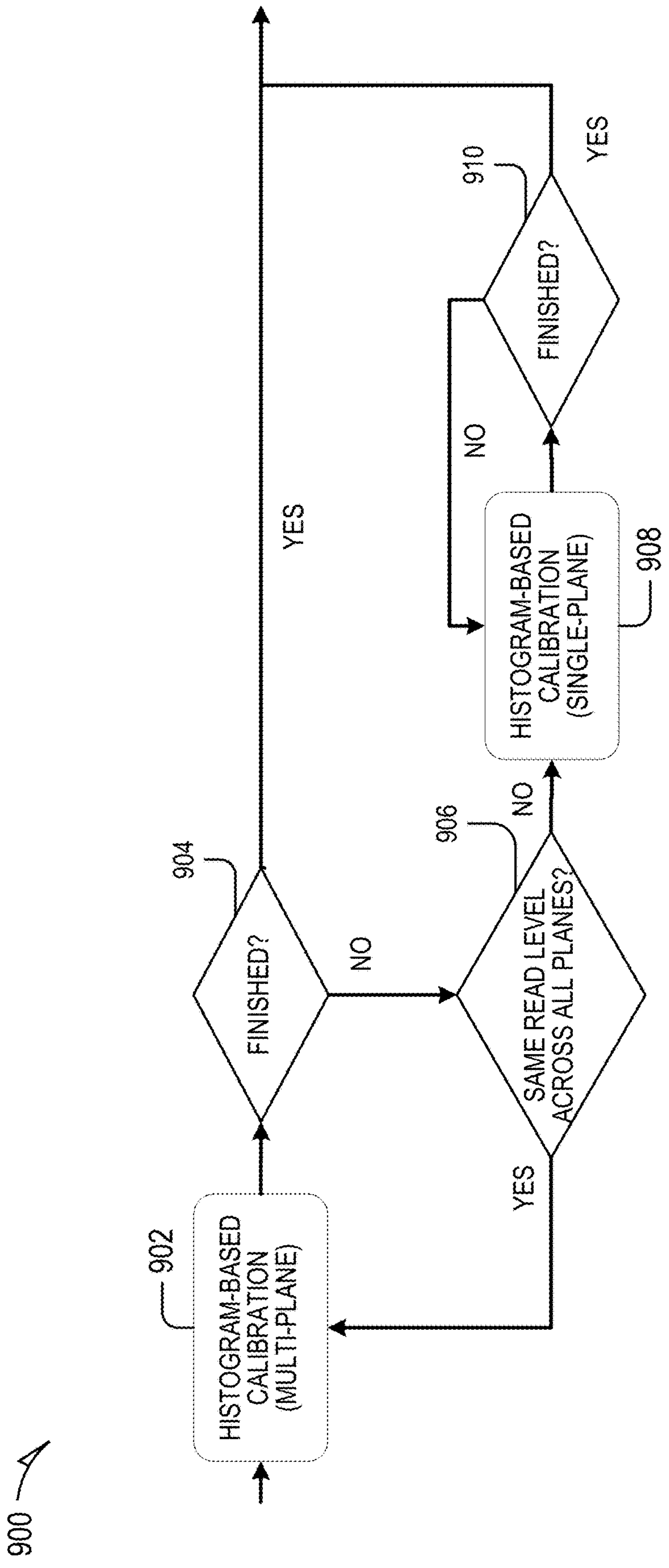

FIGS. 8 and 9 illustrate flow diagrams of example methods 800, 900 for performing a multi-plane read-level calibration process on a memory device using a coarse threshold estimate (CTE) read under multi-plane mode, in accordance with some embodiments of the present disclosure. Any of methods 800, 900 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, one or more of methods 800, 900 is performed by the memory sub-system controller 115 of FIG. 1 based on the multi-plane coarse threshold estimate (CTE) reader 113. Additionally, or alternatively, for some embodiments, one or more of methods 800, 900 is performed, at least in part, by the local media controller 135 of the memory device 130 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are used in every embodiment. Other process flows are possible.

Referring now to method 800 of FIG. 8, method 800 represents an example flow for calibrating one or more read voltage levels using multiple calibration processes, and using them in a specific order. At operation 802, a multi-plane failing byte count (CFByte) calibration process is performed to adjust read voltage levels on multiple planes (e.g., all planes) of a memory device based on a failing byte count (CFByte) of a single plane of a memory device, which is obtained by performing a multi-plane coarse threshold estimate (CTE) read in accordance with one of methods 300 or 500. At operation 804, a multi-plane failing bit count (CFBit) calibration process is performed to adjust read voltage levels on multiple planes (e.g., all planes) of a memory device based on a failing bit count (CFBit) of a single plane of a memory device, which is obtained by performing a multi-plane coarse threshold estimate (CTE) read in accordance with one of methods 300 or 500. At operation 806, a multi-plane histogram-based calibration process is performed to adjust read voltage levels on multiple planes (e.g., all planes) of a memory device based on a failing byte count (CFByte) or a failing bit count (CFBit) of each plane of a memory device, which is by performing a multi-plane coarse threshold estimate (CTE) read in accordance with one of methods 400, 600, or 700.

Referring now to method 900 of FIG. 9, method 900 represents an example flow for performing a histogram-based calibration process to adjust read voltage levels on multiple planes (e.g., all planes) of a memory device based on a failing byte count (CFByte) or a failing bit count (CFBit) of each plane of a memory device. In particular, method 900 illustrates an example transition for switching between a multi-plane mode and single-plane mode during the histogram-based calibration process when read voltage levels of each plane start to diverge. By method 900, some embodiments can ensure that calibration continues efficiently without unnecessary latency. As shown, at operation 902, a multi-plane histogram-based calibration process is performed on multiple planes (e.g., all planes) of the memory device and, operation 904 determines whether the multi-plane histogram-based calibration process is finished (e.g., whether the multi-plane histogram-based calibration process satisfies a condition that indicates a finish for). If operation 904 determines that the multi-plane histogram-based calibration process is finished, method 900 ends. If, however, operation 904 determines that the multi-plane histogram-based calibration process is not finished, method 900 proceeds to operation 906. Operation 906 determines whether read levels (read voltage levels) of the memory device are the same across all planes of the memory device. If operation 906 determines that the read levels of the memory device are the same across all planes of the memory device, method 900 returns to operation 902 to perform another iteration of the multi-plane histogram-based calibration process on multiple planes (e.g., all planes) of the memory device. If, however, operation 906 determines that the read levels of the memory device are not the same across all planes of the memory device, method 900 proceeds to operation 908, where a single plane histogram-based calibration process is performed on a single plane of the memory device. Operation 910 determines whether the single-plane histogram-based calibration process is finished (e.g., whether the single-plane histogram-based calibration process has been performed on the last plane of the memory device). If operation 910 determines that the single-plane histogram-based calibration process is not finished, method 900 returns to operation 908 to perform another iteration of the single-plane histogram-based calibration process (e.g., on another or next plane of the memory device). If, however, operation 910 determines that the single-plane histogram-based calibration process is finished, method 900 ends.

Though not illustrated, a multi-plane histogram-based calibration process can use by applying different read voltage level offsets (or read level offsets) to each plane of a memory device (while using multi-plane CTE read) using a special command (e.g., a 2Eh command) to the memory device, or by using an independent wordline (iWL) read in place of a multi-plane CTE read, where an iWL read can permit different read voltage levels to be used with different planes and permit different planes to be read at the same time. In doing so, some embodiments ensure multi-plane read mode is maintained during performance of a multi-plane histogram calibration process and the perform of method 900 can be avoided (e.g., no need to transition from multi-plane mode to single-plane mode).

Figure 10:
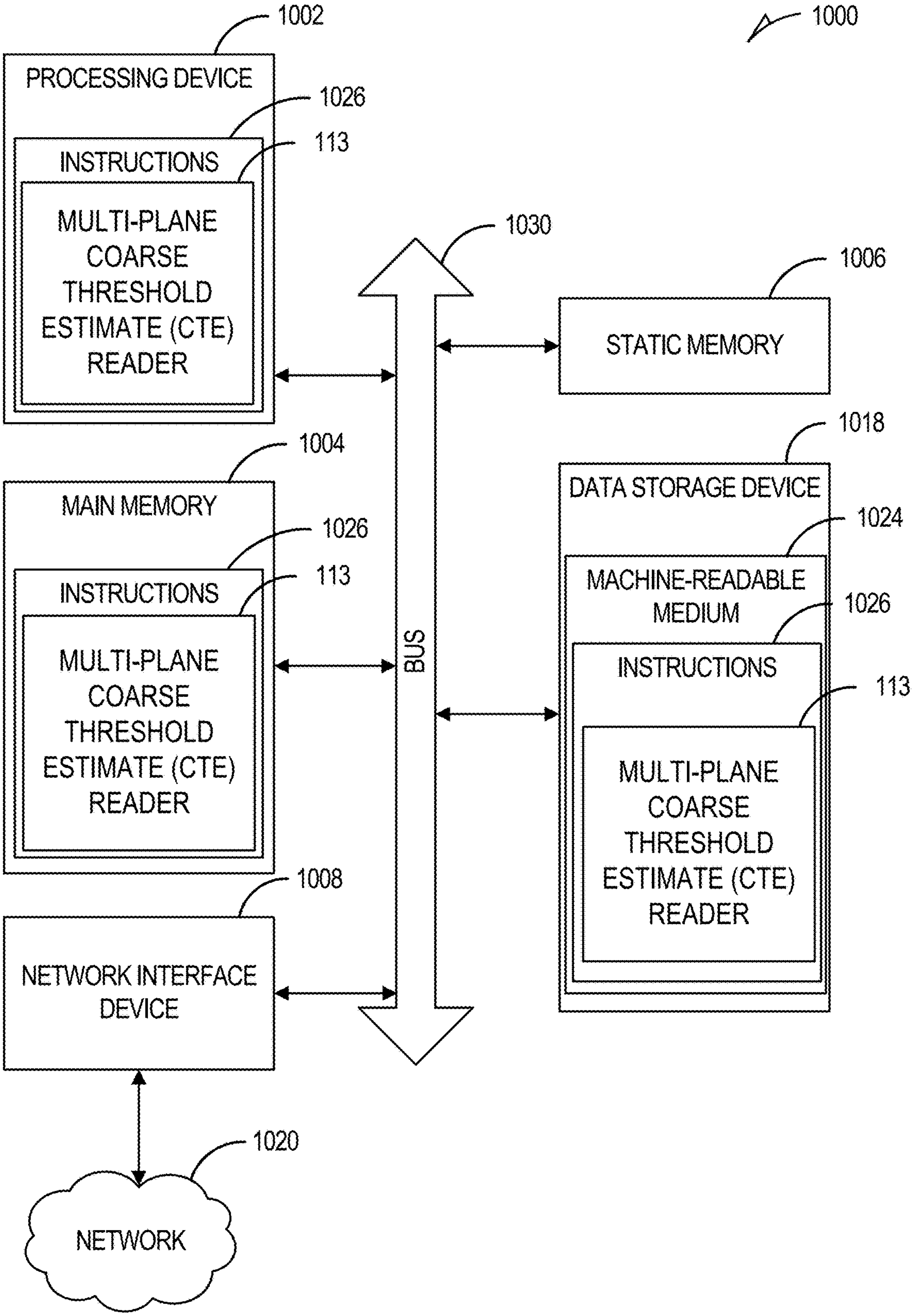
FIG. 10 is a block diagram of an example computer system in which embodiments of the present disclosure may operate.

FIG. 10 illustrates an example machine in the form of a computer system 1000 within which a set of instructions can be executed for causing the machine to perform any one or more of the methodologies discussed herein. In some embodiments, the computer system 1000 can correspond to a host system (e.g., the host system 120 of FIG. 1) that includes, is coupled to, or utilizes a memory sub-system (e.g., the memory sub-system 110 of FIG. 1) or can be used to perform the operations described herein. In alternative embodiments, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., ROM, flash memory, DRAM such as SDRAM or Rambus DRAM (RDRAM), etc.), a static memory 1006 (e.g., flash memory, static random access memory (SRAM), etc.), and a data storage device 1018, which communicate with each other via a bus 1030.

The processing device 1002 represents one or more general-purpose processing devices such as a microprocessor, a central processing unit, or the like. More particularly, the processing device 1002 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 1002 can also be one or more special-purpose processing devices such as an application-specific integrated circuit (ASIC), a field programmable gate array (FPGA), a digital signal processor (DSP), a network processor, or the like. The processing device 1002 is configured to execute instructions 1026 for performing the operations and steps discussed herein. The computer system 1000 can further include a network interface device 1008 to communicate over a network 1020.

The data storage device 1018 can include a machine-readable storage medium 1024 (also known as a computer-readable medium) on which is stored one or more sets of instructions 1026 or software embodying any one or more of the methodologies or functions described herein. For some embodiments, the machine-readable storage medium 1024 is a non-transitory machine-readable storage medium. The instructions 1026 can also reside, completely or at least partially, within the main memory 1004 and/or within the processing device 1002 during execution thereof by the computer system 1000, the main memory 1004 and the processing device 1002 also constituting machine-readable storage media. The machine-readable storage medium 1024, data storage device 1018, and/or main memory 1004 can correspond to the memory sub-system 110 of FIG. 1.

In one embodiment, the instructions 1026 include instructions to implement functionality corresponding to coarse threshold estimate (CTE) read on a memory device under multi-plane mode as described herein (e.g., the multi-plane coarse threshold estimate (CTE) reader 113 of FIG. 1). While the machine-readable storage medium 1024 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

In view of the above-described implementations of subject matter this application discloses the following list of examples, wherein one feature of an example in isolation or more than one feature of an example, taken in combination and, optionally, in combination with one or more features of one or more further examples are further examples also falling within the disclosure of this application.

Example 1 is a system comprising: a memory device comprising a plurality of memory cells across a plurality of planes; and a processing device, operatively coupled to the memory device, configured to perform operations comprising: performing a multi-plane coarse threshold estimate read on a subset of the plurality of memory cells across at least a sub-plurality of the plurality of planes, the multi-plane coarse threshold estimate read comprising: performing a read strobe using a read voltage level on the subset of the plurality of memory cells across the at least sub-plurality of planes; and determining a count of non-conducting bitlines connected to the subset of the plurality of memory cells on a single plane of the at least sub-plurality of the plurality of planes, the count of non-conducting bitlines on the single plane being representative of all of the at least sub-plurality of planes; and receiving, from the memory device, the count of non-conducting bitlines on the single plane.

In Example 2, the subject matter of Example 1 includes, wherein the multi-plane coarse threshold estimate read is configured to select the single plane based on a user-defined parameter.

In Example 3, the subject matter of Examples 1-2 includes, wherein the multi-plane coarse threshold estimate read is performed as part of a multi-plane failed bit count (CFBit) calibration process, the multi-plane CFBit calibration process being configured to adjust one or more read voltage levels of the read strobe on each plane of the at least sub-plurality of planes based on the count of non-conducting bitlines on the single plane, the count of non-conducting bitlines on the single plane being a failed bit count.

In Example 4, the subject matter of Examples 1-3 includes, wherein the multi-plane coarse threshold estimate read is performed as part of a multi-plane failed byte count (CFByte) calibration process, the multi-plane CFByte calibration process being configured to adjust one or more read voltage levels of the read strobe on each plane of the at least sub-plurality of planes based on the count of non-conducting bitlines on the single plane, the count of non-conducting bitlines on the single plane being a failed byte count.

In Example 5, the subject matter of Examples 1-4 includes, wherein the multi-plane coarse threshold estimate read is a first multi-plane coarse threshold estimate read, and wherein the operations comprise: performing a second multi-plane coarse threshold estimate read on the subset of the plurality of memory cells across the at least sub-plurality of planes, the second coarse threshold estimate read comprising: performing the read strobe using the read voltage level on the subset of the plurality of memory cells across the at least sub-plurality of planes; and determining a plurality of counts of non-conducting bitlines connected to the subset of the plurality of memory cells for the at least sub-plurality of planes; sending at least one request to the memory device to provide at least one count from the plurality of counts; and in response to the request, receiving, from the memory device, the at least one count the plurality of counts.

In Example 6, the subject matter of Examples 4-5 includes, wherein the determining of the plurality of counts of non-conducting bitlines for the at least sub-plurality of planes comprises serially determining, for each individual plane of the at least sub-plurality of the plurality of planes, an individual count of non-conducting bitlines connected to the subset of the plurality of memory cells on the individual plane.

In Example 7, the subject matter of Examples 4-6 includes, wherein the determining of the plurality of counts of non-conducting bitlines for the at least sub-plurality of planes comprises determining, in parallel for each individual plane of the at least sub-plurality of the plurality of planes, an individual count of non-conducting bitlines connected to the subset of the plurality of memory cells on the individual plane.

In Example 8, the subject matter of Examples 4-7 includes, wherein the second multi-plane coarse threshold estimate read is performed as part of a multi-plane histogram-based calibration process, the multi-plane histogram-based calibration process being configured to adjust one or more read voltage levels of the read strobe on each plane of the at least sub-plurality of planes based on the plurality of counts of non-conducting bitlines for the at least sub-plurality of planes.

In Example 9, the subject matter of Examples 1-8 includes, wherein the count of non-conducting bitlines on the single plane is received as part of a set of metadata values received from the memory device, the set of metadata values characterizing the read voltage level with respect to threshold voltage distributions of the subset of the plurality of memory cells, the set of metadata values.

In Example 10, the subject matter of Examples 1-9 includes, wherein the operations comprise: after the performing of the multi-plane coarse threshold estimate read, sending a request to the memory device to provide the count of non-conducting bitlines on the single plane, the count of non-conducting bitlines on the single plane being received from the memory device in response to the request.

In Example 11, the subject matter of Examples 1-10 includes, wherein the processing device is part of a local media controller, and the local media controller is part of the memory device.

Example 12 is at least one machine-readable medium including instructions that, when executed by a processing device of a memory sub-system, cause the processing device to perform operations to implement of any of Examples 1-11.

Example 13 is a method to implement of any of Examples 1-11.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer-readable storage medium, such as, but not limited to, any type of disk including floppy disks, optical disks, CD- ROMs, and magnetic-optical disks, ROMs, RAMs, EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium (e.g., non-transitory machine-readable medium) having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a ROM, RAM, magnetic disk storage media, optical storage media, flash memory components, and so forth.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:

a memory device comprising a plurality of memory cells across a plurality of planes; and a processing device, operatively coupled to the memory device, configured to perform operations comprising:

performing a multi-plane coarse threshold estimate read on a subset of the plurality of memory cells across at least a sub-plurality of the plurality of planes, the multi-plane coarse threshold estimate read comprising:

performing a read strobe using a read voltage level on the subset of the plurality of memory cells across the at least sub-plurality of planes; and determining a count of non-conducting bitlines connected to the subset of the plurality of memory cells on a single plane of the at least sub-plurality of the plurality of planes, the count of non-conducting bitlines on the single plane being representative of all of the at least sub-plurality of planes; and receiving, from the memory device, the count of non-conducting bitlines on the single plane.

2. The system of claim 1, wherein the multi-plane coarse threshold estimate read is configured to select the single plane based on a user-defined parameter.

3. The system of claim 1, wherein the multi-plane coarse threshold estimate read is performed as part of a multi-plane failed bit count (CFBit) calibration process, the multi-plane CFBit calibration process being configured to adjust one or more read voltage levels of the read strobe on each plane of the at least sub-plurality of planes based on the count of non-conducting bitlines on the single plane, the count of non-conducting bitlines on the single plane being a failed bit count.

4. The system of claim 1, wherein the multi-plane coarse threshold estimate read is performed as part of a multi-plane failed byte count (CFByte) calibration process, the multi-plane CFByte calibration process being configured to adjust one or more read voltage levels of the read strobe on each plane of the at least sub-plurality of planes based on the count of non-conducting bitlines on the single plane, the count of non-conducting bitlines on the single plane being a failed byte count.

5. The system of claim 1, wherein the multi-plane coarse threshold estimate read is a first multi-plane coarse threshold estimate read, and wherein the operations comprise:

performing a second multi-plane coarse threshold estimate read on the subset of the plurality of memory cells across the at least sub-plurality of planes, the second coarse threshold estimate read comprising:

performing the read strobe using the read voltage level on the subset of the plurality of memory cells across the at least sub-plurality of planes; and determining a plurality of counts of non-conducting bitlines connected to the subset of the plurality of memory cells for the at least sub-plurality of planes;

sending at least one request to the memory device to provide at least one count from the plurality of counts; and in response to the request, receiving, from the memory device, the at least one count the plurality of counts.

6. The system of claim 5, wherein the determining of the plurality of counts of non-conducting bitlines for the at least sub-plurality of planes comprises serially determining, for each individual plane of the at least sub-plurality of the plurality of planes, an individual count of non-conducting bitlines connected to the subset of the plurality of memory cells on the individual plane.

7. The system of claim 5, wherein the determining of the plurality of counts of non-conducting bitlines for the at least sub-plurality of planes comprises determining, in parallel for each individual plane of the at least sub-plurality of the plurality of planes, an individual count of non-conducting bitlines connected to the subset of the plurality of memory cells on the individual plane.

8. The system of claim 5, wherein the second multi-plane coarse threshold estimate read is performed as part of a multi-plane histogram-based calibration process, the multi-plane histogram-based calibration process being configured to adjust one or more read voltage levels of the read strobe on each plane of the at least sub-plurality of planes based on the plurality of counts of non-conducting bitlines for the at least sub-plurality of planes.

9. The system of claim 1, wherein the count of non-conducting bitlines on the single plane is received as part of a set of metadata values received from the memory device, the set of metadata values characterizing the read voltage level with respect to threshold voltage distributions of the subset of the plurality of memory cells, the set of metadata values.

10. The system of claim 1, wherein the operations comprise:

after the performing of the multi-plane coarse threshold estimate read, sending a request to the memory device to provide the count of non-conducting bitlines on the single plane, the count of non-conducting bitlines on the single plane being received from the memory device in response to the request.

11. The system of claim 1, wherein the processing device is part of a local media controller, and the local media controller is part of the memory device.

12. At least one non-transitory machine-readable storage medium comprising instructions that, when executed by a processing device of a memory sub-system, cause the processing device to perform operations comprising:

performing a multi-plane coarse threshold estimate read on a plurality of memory cells across a plurality of planes of a memory device of the memory sub-system, the multi-plane coarse threshold estimate read comprising:

performing a read strobe using a read voltage level on the plurality of memory cells across the plurality of planes; and determining a count of non-conducting bitlines connected to the plurality of memory cells on a single plane of the plurality of planes, the count of non-conducting bitlines on the single plane being representative of all of the plurality of planes; and receiving, from the memory device, the count of non-conducting bitlines on the single plane.

13. The at least one non-transitory machine-readable storage medium of claim 12, wherein the multi-plane coarse threshold estimate read is configured to select the single plane based on a user-defined parameter.

14. The at least one non-transitory machine-readable storage medium of claim 12, wherein the multi-plane coarse threshold estimate read is performed as part of a multi-plane failed bit count (CFBit) calibration process, the multi-plane CFBit calibration process being configured to adjust one or more read voltage levels of the read strobe on each plane of the plurality of planes based on the count of non-conducting bitlines on the single plane, the count of non-conducting bitlines on the single plane being a failed bit count.

15. The at least one non-transitory machine-readable storage medium of claim 12, wherein the multi-plane coarse threshold estimate read is performed as part of a multi-plane failed byte count (CFByte) calibration process, the multi-plane CFByte calibration process being configured to adjust one or more read voltage levels of the read strobe on each plane of the plurality of planes based on the count of non-conducting bitlines on the single plane, the count of non-conducting bitlines on the single plane being a failed byte count.

16. The at least one non-transitory machine-readable storage medium of claim 12, wherein the multi-plane coarse threshold estimate read is a first multi-plane coarse threshold estimate read, and wherein the operations comprise:

performing a second multi-plane coarse threshold estimate read on the plurality of memory cells across the plurality of planes, the second coarse threshold estimate read comprising:

performing the read strobe using the read voltage level on the plurality of memory cells across the plurality of planes; and determining a plurality of counts of non-conducting bitlines connected to the plurality of memory cells for the plurality of planes;

sending at least one request to the memory device to provide at least one count from the plurality of counts; and in response to the request, receiving, from the memory device, the at least one count the plurality of counts.

17. The at least one non-transitory machine-readable storage medium of claim 16, wherein the determining of the plurality of counts of non-conducting bitlines for the plurality of planes comprises serially determining, for each individual plane of the plurality of planes, an individual count of non-conducting bitlines connected to the plurality of memory cells on the individual plane.

18. The at least one non-transitory machine-readable storage medium of claim 16, wherein the determining of the plurality of counts of non-conducting bitlines for the plurality of planes comprises determining, in parallel for each individual plane of the plurality of planes, an individual count of non-conducting bitlines connected to the plurality of memory cells on the individual plane.

19. The at least one non-transitory machine-readable storage medium of claim 16, wherein the second multi-plane coarse threshold estimate read is performed as part of a multi-plane histogram-based calibration process, the multi-plane histogram-based calibration process being configured to adjust one or more read voltage levels of the read strobe on each plane of the plurality of planes based on the plurality of counts of non-conducting bitlines for the plurality of planes.

20. A method comprising:

performing a multi-plane coarse threshold estimate read on a plurality of memory cells across a plurality of planes of a memory device, the multi-plane coarse threshold estimate read comprising:

performing a read strobe using a read voltage level on the plurality of memory cells across the plurality of planes; and determining a count of non-conducting bitlines connected to the plurality of memory cells on a single plane of the plurality of planes, the count of non-conducting bitlines on the single plane being representative of all of the plurality of planes;

sending a request to the memory device to provide the count of non-conducting bitlines on the single plane; and in response to the request, receiving, from the memory device, the count of non-conducting bitlines on the single plane.

* * * * *